United States Patent
Sakai

(10) Patent No.: US 11,710,746 B2
(45) Date of Patent: Jul. 25, 2023

(54) SEMICONDUCTOR DEVICE AND DISPLAY DEVICE

(71) Applicant: Japan Display Inc., Tokyo (JP)

(72) Inventor: Takeshi Sakai, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 119 days.

(21) Appl. No.: 17/191,725

(22) Filed: Mar. 4, 2021

(65) Prior Publication Data

US 2021/0280614 A1    Sep. 9, 2021

(30) Foreign Application Priority Data

Mar. 5, 2020    (JP) ................... 2020-037649

(51) Int. Cl.
*H01L 27/12*    (2006.01)
*G02F 1/1362*    (2006.01)

(52) U.S. Cl.
CPC .... *H01L 27/1237* (2013.01); *G02F 1/136277* (2013.01)

(58) Field of Classification Search
CPC ............. H01L 27/1251; H01L 27/1248; H01L 27/1225; H01L 27/1237; H01L 29/7869; H01L 29/4908; H01L 29/78633; G02F 1/136277; G02F 1/136286; G02F 1/134336; G02F 1/136204
See application file for complete search history.

(56) References Cited

U.S. PATENT DOCUMENTS

| | | | | |
|---|---|---|---|---|
| 9,331,207 | B2* | 5/2016 | Yamazaki | H01L 29/201 |
| 10,811,435 | B2* | 10/2020 | Yamazaki | H01L 29/7869 |
| 10,811,438 | B2* | 10/2020 | Choi | H01L 27/3272 |
| 2009/0065771 | A1 | 3/2009 | Iwasaki et al. | |
| 2014/0021466 | A1* | 1/2014 | Yamazaki | H01L 29/7869 257/43 |
| 2019/0164999 | A1* | 5/2019 | Choi | H01L 27/3272 |
| 2019/0244981 | A1* | 8/2019 | Yamazaki | H01L 29/78648 |

FOREIGN PATENT DOCUMENTS

JP    2007-250983 A    9/2007

* cited by examiner

*Primary Examiner* — Nikolay K Yushin
(74) *Attorney, Agent, or Firm* — Xsensus LLP

(57) ABSTRACT

The semiconductor device comprises a gate electrode, a first gate insulating film overlapping a part of the side surface and the upper surface of the gate electrode, a second gate insulating film overlapping the upper surface of the gate electrode, a semiconductor film provided on the upper surface of the second gate insulating film and overlapping the gate electrode and a first terminal and a second terminal overlapping the upper surface of the semiconductor film. In a plan view, a first region is a region where the semiconductor film overlaps the upper surface of the first gate insulating film and the second gate insulating film between the first terminal and the second terminal, and a third region is a region that overlaps both a part of the upper surface of the gate electrode and the second gate insulating film and does not overlap the first gate insulating film.

14 Claims, 18 Drawing Sheets

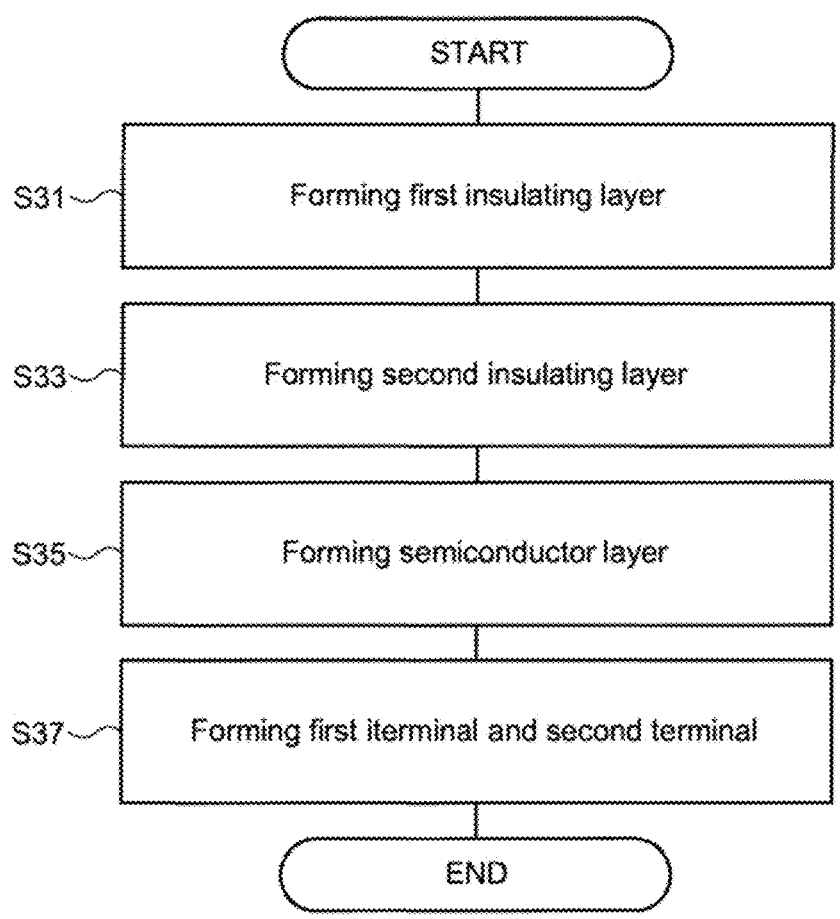

FIG. 10
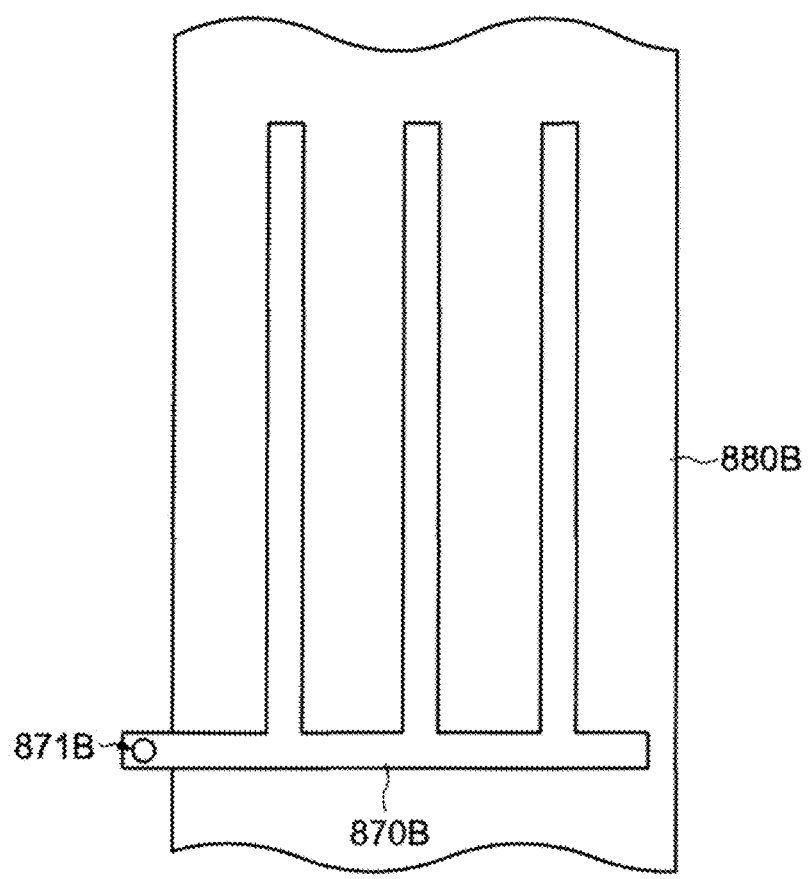
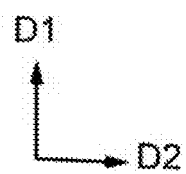

SEMICONDUCTOR DEVICE AND DISPLAY DEVICE

CROSS-REFERENCE TO RELATED APPLICATION

This application is based upon and claims the benefit of priority from the prior Japanese Patent Application No. 2020-037649, filed on Mar. 5, 2020, the entire contents of which are incorporated herein by reference.

FIELD

An embodiment of the present invention relates to a semiconductor device and a display device.

BACKGROUND

The Group 14 elements such as silicon and germanium have been widely used in a semiconductor device such as a thin film transistor. Group 14 elements such as silicon and germanium are typical materials exhibiting semiconductor characteristics. For example, Japanese laid-open patent publication No. 2007-250983 discloses a thin film transistor (Thin Film Transistor or TFT) having an oxide semiconductor made of an oxide of the Group 13 elements typified by indium or gallium. Display devices using a thin film transistor having an oxide semiconductor has also been actively developed.

SUMMARY

A semiconductor device according to an embodiment includes: a gate electrode, a first gate insulating film overlapping a part of the side surface and a part of the upper surface of the gate electrode, a second gate insulating film overlapping a part of the upper surface of the gate electrode, a semiconductor film overlapping the gate electrode, a first terminal and a second terminal overlapping the upper surface of the semiconductor film; in a plan view, a first region is a region in which the semiconductor film overlaps the upper surface of the first gate insulating film and the second gate insulating film between the first terminal and the second terminal and a third region is a region that overlaps both a part of the upper surface of the gate electrode and the second gate insulating film and dies not overlap the first gate insulating film, and the first region is provided between the first terminal and the third region in a plan view.

A display device according to an embodiment includes: pixel having a light emitting element and a first transistor electrically connected to the light emitting element; the first transistor having a gate electrode, the first gate insulating film that overlaps a part of the side surface and a part of the upper surface of the gate electrode, a second gate insulating film that overlaps a part of the upper surface of the gate electrode, a semiconductor film provided on the upper surface of the second gate insulating film and overlapping the gate electrode, and the first terminal and the second terminal that overlap the upper surface of the semiconductor film; in a plan view, between the first terminal and the second terminal, a first region is a region in which the semiconductor film overlaps the upper surface of the first gate insulating film and a second gate insulating film, and a third region is a region in which the semiconductor film overlaps a part of the upper surface of the gate electrode and the second gate insulating film and does not overlap the first gate insulating film, and the first region is provided between the first terminal and the third region in a plan view.

A semiconductor device according to an embodiment includes: a gate electrode, a gate insulating film overlaps the gate electrode, a semiconductor film provided on the upper surface of the gate insulating film and overlapping the gate electrode, and a first terminal and a second terminal overlapping the upper surface of the semiconductor film; in a plan view, a first region is a region in which the semiconductor film overlaps a first film thickness region and a third region is a region in which the semiconductor film overlaps a second film thickness region, and the first region is provided between the first terminal and the third region in a plan view.

BRIEF DESCRIPTION OF DRAWINGS

FIG. 3 is a flow chart showing a manufacturing method of a semiconductor device according to an embodiment;

FIG. 10 is a top view showing a pixel electrode and a common electrode of a display device according to an embodiment;

DESCRIPTION OF EMBODIMENTS

Figure 1A:
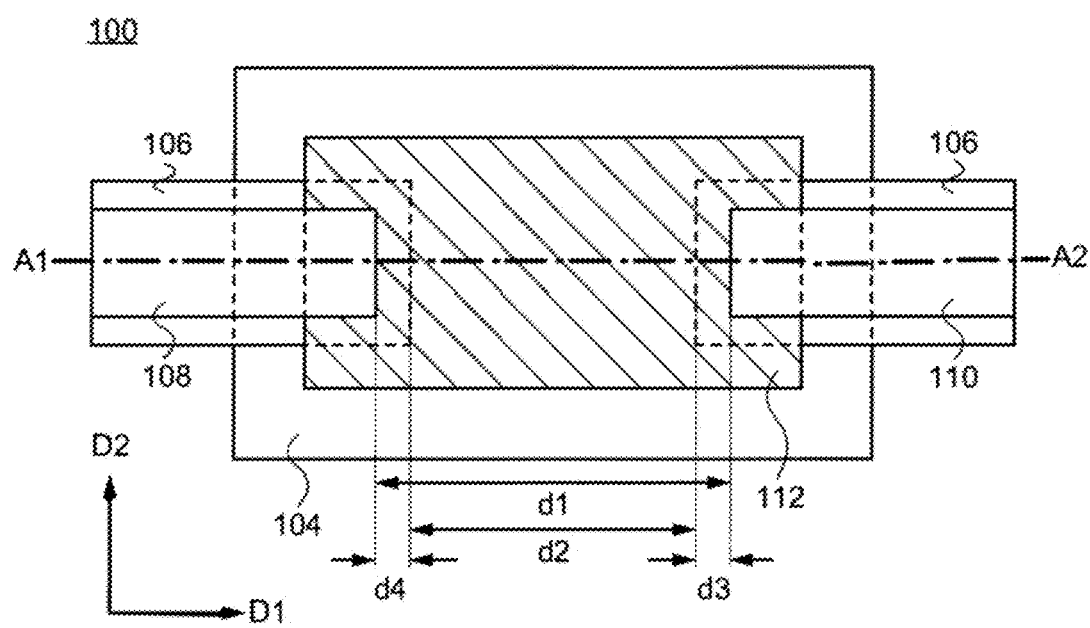
FIG. 1A is top view showing a configuration of a semiconductor device according to an embodiment.

The embodiments of the present invention are explained below while referring to the drawings and the like. However, the present invention can be carried out in many different modes and should not be interpreted as being limited to the description of the following embodiments.

In the drawings, although each part of widths, thicknesses, shapes and the like may be schematically represented for configurations as compared with actual embodiments, such explanations are merely an example and do not limit the interpretation of the present invention. In an embodiment, elements having functions similar to those described with reference to a previously mentioned figure are denoted with the same reference numerals, and duplicate descriptions may be omitted.

In the present invention, when a plurality of films is formed by processing one film, the plurality of films may have functions and roles different from each other. However, the plurality of films originates from a film formed as the same layer in the same process, and has the same layer structure and the same material. Therefore, the plurality of films is defined as films existing in the same layer.

In an embodiment, when it is simply described as "over" for expressing a mode in which another structure is arranged on a certain structure, unless otherwise specified, it includes both the case of arranging another structure directly above and the case of arranging another structure above a certain structure through yet another structure.

In an embodiment, the expression of "one structure is exposed from another structure" means in which a part of one structure is not directly or indirectly covered by another structure, and also includes modes in which the part uncovered by another structure is directly or indirectly covered by another structure.

In an embodiment, the same reference numerals are used to generically refer to the same or similar elements. The same reference numerals are used to distinguish multiple parts of one configuration, and hyphens and natural numbers are used.

In an embodiment, a display device refers to a structure that displays an image using electro-optic layers. For example, the term ohf the display device may refer to a display panel that includes an electro-optic layer, or it may refer to a structure with other optical members (e.g., polarized member, backlight, touch panel, etc.) attached to the display cell. As used herein, an "electro-optic layer" may include a liquid crystal layer, an electroluminescence (EL) layer, an electrochromic (EC) layer, and an electrophoresis layer, as long as there is no technical contradiction. Therefore, although the embodiment described later will be described by exemplifying a liquid crystal display device including a liquid crystal layer and an organic EL display device including an organic EL layer as a display device, the structures in the present embodiment can be applied to a display device including the other electro-optical layers described above.

In an embodiment, expressions such as "a includes A, B or C," "a includes any one of A, B and C," "a includes one selected from a group consisting of A, B and C," do not exclude cases where a includes multiple combinations of A to C unless otherwise indicated. Furthermore, these expressions do not exclude the case where a includes other elements.

The following embodiments can be combined with each other as long as there is no technical contradiction.

TFT includes a semiconductor film (active layer), a source electrode, a drain electrode, and a gate electrode. By applying a voltage to the source electrode, the drain electrode, and the gate electrode of TFT, current flows through channels formed in the semiconductor film. It is known that repetitive voltages applied to TFT degrade the semiconductor film, particularly in the vicinity of the drain electrode. For example, when TFT having an oxide semiconductor is used as a pixel of a display device, the TFT is required to have a high current supplying capability and hardly deteriorate. However, by repeatedly driving the display device, since the repeated voltage is applied to the TFT, the TFT is deteriorated. As a result, the current supplying capability of the TFT is also reduced. That is, the reliability of the display device is reduced.

One of the challenges of an embodiment is to provide a reliable semiconductor device with the suppressed deterioration of characteristics. For example, one of the challenges is to provide a highly reliable semiconductor device that includes an oxide semiconductor in an active layer. One of the challenges of an embodiment of the present disclosure is to provide a method for suppressing deterioration of characteristics of a semiconductor device. One of the challenges of an embodiment of the present disclosure is to provide a display device including these semiconductor devices.

1. First Embodiment

In an embodiment, a construction of a semiconductor device 100 will be described. In an embodiment, the semiconductor device 100 is, for example, a thin film transistor (Thin Film Transistor, TFT). T thin film transistor include, for example, an oxide semiconductor as the semiconductor film. The semiconductor device 100 of the embodiment shown below may be used in, for example, an integrated circuit (Integrated Circuit, IC) such as a microprocessor (Micro-Processing Unit, MPU) or the memory circuit in addition to the semiconductor device such as transistors used in a display device.

<1-1. Configuration of Semiconductor Device 100>

Figure 1B:
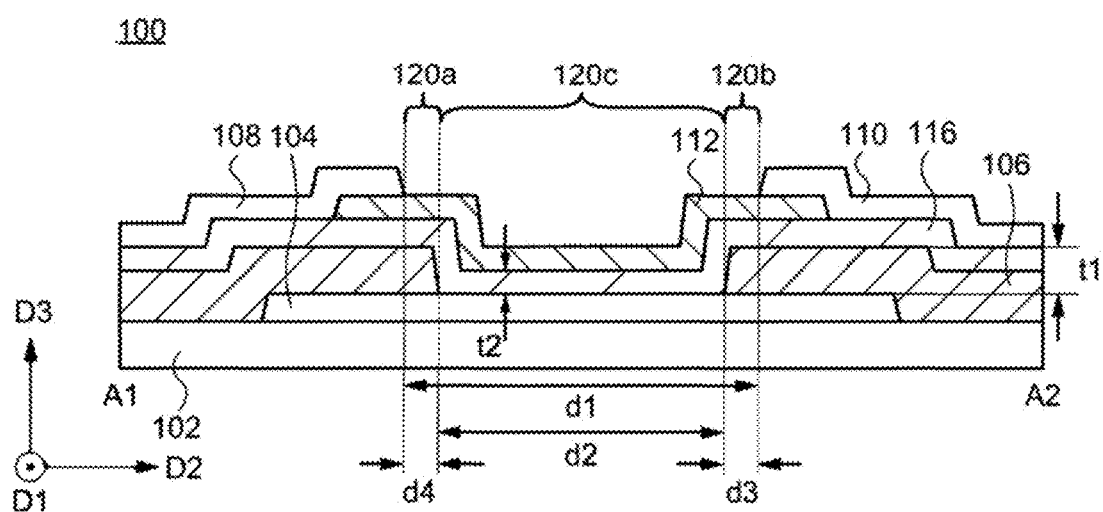
FIG. 1B is a cross-sectional view showing a configuration of a semiconductor device according to an embodiment.

FIG. 1A is a top view showing a configuration of the semiconductor device 100 according to an embodiment, FIG. 1B is a cross-sectional view along A1-A2 line of the semiconductor device 100 according to an embodiment shown in FIG. 1A. The configuration of the semiconductor device 100 according to an embodiment is not limited to the configurations shown in FIGS. 1A and 1B.

For example, the semiconductor device 100 according to the present embodiment will be described in detail below mainly referring to FIGS. 1 and 2. The semiconductor device 100 according to an embodiment includes a gate electrode 104, a first gate insulating film 106 overlapping a part of the side surface and a part of the upper surface of the gate electrode 104, a second gate insulating film 116 overlapping a part of the upper surface of the gate electrode 104 and a part of the side surfaces and a part of the upper surface of the first gate insulating film 106, a semiconductor film 112 provided on the upper surface of the second gate insulating film 116 and overlapping the gate electrode 104, a first terminal 108 and a second terminal 110 overlapping the upper surface of the semiconductor film 112, and a first region 120a between the first terminal 108 and the second terminal 110. In the first region 120a, the semiconductor film 112 overlaps the upper surface of the first gate insulating film 106 and the second gate insulating film 116.

As shown in FIG. 1A and FIG. 1B, the semiconductor device 100 is provided over a substrate 102. The semiconductor device 100 basically includes the gate electrode 104, the first gate insulating film 106, the semiconductor film 112, the first terminal 108, the second terminal 110, and the second gate insulating film 116. Although not shown, the semiconductor device 100 may have a protective film on the first terminal 108, the second terminal 110, and the semiconductor film 112. For example, in an embodiment, the direction parallel or substantially parallel to the longitudinal axis of the gate electrode 104 is a first direction D1, the direction intersecting the first direction is a second direction D2, the direction intersecting the first direction and the second direction parallel or substantially parallel to the tangential direction of the substrate 102 is a third direction D3.

In the examples shown in FIG. 1A and FIG. 1B, the gate electrode 104 is provided in contact with the substrate 102. The gate electrode 104 may be provided on the substrate 102 via an undercoat (not shown). The gate electrode 104 is supplied with a voltage from, for example, an external circuit (not shown). When the gate electrode 104 is supplied with a voltage, carriers (charges) are accumulated in the semiconductor film 112 near the interface between the second gate insulating film 116 and the semiconductor film 112. An insulating layer as an under layer may be provided between the gate electrode 104 and the substrate 102.

The first gate insulating film 106 is provided over the substrate 102 and the gate electrode 104 and covers a part of the gate electrode 104. In particular, the first gate insulating film 106 overlaps and covers a part of the side surface and a part of upper surface of the gate electrode 104.

A thickness t1 of the first gate insulating film 106 can be arbitrarily determined. The thickness t1 of the first gate insulating film 106 can be appropriately selected, for example, from a range of 200 nm or more and 2000 nm or less. In the semiconductor device 100 according to an embodiment, the thickness t1 of the first gate insulating film 106 is, for example, 1500 nm. The thickness t1 of the first gate insulating film 106 is, for example, the length of the first gate insulating film 106 from the surface where the first gate insulating film 106 and the gate electrode 104 are in contact with each other to the surface where the first gate insulating film 106 and the second gate insulating film 116 are in contact with each other. The thickness t1 of the first gate insulating film 106 is the length of the first gate insulating film 106 in the third direction D3 (normal direction of the substrate 102).

The first gate insulating film 106 is provided to have a margin d4 to the first terminal 108 and is provided to have a margin d3 to the second terminal 110. The length between the first gate insulating films 106 is a length d2.

The second gate insulating film 116 is provided over the gate electrode 104 and the first gate insulating film 106 and covers the gate electrode 104 and the first gate insulating film 106. In particular, the second gate insulating film 116 overlaps and covers a part of the upper surface of the gate electrode 104 and a part of the side surface and a part of the upper surface of the first gate insulating film 106.

The thickness t2 of the second gate insulating film 116 can be arbitrarily determined. The thickness t2 of the second gate insulating film 116 can be appropriately selected, for example, from a range of 10 nm or more and 500 nm or less. In the semiconductor device 100 according to an embodiment, the thickness t2 of the second gate insulating film 116 is, for example, 500 nm. The thickness t2 of the second gate insulating film 116 is, for example, the length of the second gate insulating film 116 from the surface where the second gate insulating film 116 and the gate electrode 104 are in contact with each other to the surface where the second gate insulating film 116 and the semiconductor film 112 are in contact with each other. The thickness t2 of the second gate insulating film 116 is the length of the second gate insulating film 116 in the normal direction of the substrate 102.

The semiconductor film 112 is provided on the second gate insulating film 116. Specifically, the semiconductor film 112 is provided on the upper surface and the side surface of the second gate insulating film 116. One part of the semiconductor film 112 is provided so as to overlap with the gate electrode 104, and another part of the semiconductor film 112 does not overlap with the gate electrode 104.

The first terminal 108 and the second terminal 110 are provided on the first gate insulating film 106, the second gate insulating film 116, and the semiconductor film 112. Specifically, the first terminal 108 and the second terminal 110 are provided on the same surface as the upper surface of the second gate insulating film 116 on which the semiconductor film 112 is provided, and on the upper surface and the side surface of the semiconductor film 112. The first terminal 108 and the second terminal 110 are electrically connected to the semiconductor film 112 by contacting the semiconductor film 112. By applying a desired voltage to each of the gate electrode 104, the first terminal 108, and the second terminal 110, it is possible to flow a current to the semiconductor film 112.

As shown in FIG. 1B, three regions (the first region 120a, a second region 120b, a third region 120c) are defined. The three regions (the first region 120a, the second region 120b, the third region 120c) are sandwiched between the first terminal 108 and the second terminal 110 by the arrangement of the gate electrode 104, the first gate insulating film 106, the semiconductor film 112, the first terminal 108, the second terminal 110, and the second gate insulating film 116.

The first region 120a here is a region where the semiconductor film 112 overlaps with the gate electrode 104, the first gate insulating film 106, and the second gate insulating film 116, and does not overlap with the first terminal 108. The first region 120a is provided on the side closer to the first terminal 108. The second region 120b has a configuration similar to that of the first region 120a, but is provided on the side closer to the second terminal 110.

The third region 120c is provided between the first region 120a and the second region 120b and contacts the first region 120a and the second region 120b. The third region 120c is a region where the semiconductor film 112 overlaps with a part of the upper surface of the gate electrode 104 and the second gate insulating film 116, and does not overlap with the first gate insulating film 106. The first region 120a is separated from the second region 120b by the third region 120c. The first region 120a, the second region 120b, and the third region 120c are provided so that the first terminal 108 and the second terminal 110 are aligned in a region that does not overlap with the gate electrode 104.

In the semiconductor film 112, the region between the first terminal 108 and the second terminal 110, that is, the first region 120a, the second region 120b, and the third region 120c function as an active region (channel) of the semiconductor device 100.

The first region 120a and the second region 120b include the first gate insulating film 106 between the gate electrode 104 and the semiconductor film 112 compared to the third region 120c. Thus, in the first region 120a and the second region 120b, the thickness of the gate insulating film between the semiconductor film 112 and the gate electrode 104 is the thickness of the sum of the thickness t1 of the first gate insulating film 106 and the thickness t2 of the second gate insulating film 116. Thus, the thickness of the gate insulating film in the first region 120a and the second region 120b can be greater than the thickness of the gate insulating film to the semiconductor film 112 in the third region 120c. On the other hand, the third region 120c does not include the first gate insulating film 106 between the gate electrode 104 and the semiconductor film 112 compared to the first region 120*a* and the second region 120*b*. Thus, the thickness of the gate insulating film to the semiconductor film 112 in the third region 120*c* may be less than the thickness of the gate insulating film in the first region 120*a* and the second region 120*b*. That is, between the first terminal 108 and the second terminal 110, the semiconductor device 100 according to an embodiment may have a region (the first region 120*a* and the second region 120*b*) having a thick gate insulating film and a region (the third region 120*c*) having a thin gate insulating film.

Here, as an example, in the semiconductor device 100 according to an embodiment, the electrical characteristics of the semiconductor device 100 will be described in the case where the first terminal 108 and the second terminal 110 are respectively a source electrode and a drain electrode. For example, a constant voltage such as GND, common voltage, and 0V is supplied to the first terminal 108. On the other hand, the second terminal 110 is supplied with a signal that changes from a high voltage to a low voltage (equal to or higher than the voltage applied to the first terminal) or from a low voltage to a high voltage. The signal may be periodic or aperiodic. For example, it is assumed that a periodic signal is supplied to the second terminal 110 serving as a drain electrode. In the conventional semiconductor device, when a periodic signal is supplied to the second terminal and a current flows through the channel of the semiconductor film, degradation easily progresses particularly between the second terminal serving as a drain electrode and the channel of the semiconductor film. Consequently, the properties of the semiconductor device change. This behavior is called AC-stress degradation.

The semiconductor device 100 according to an embodiment has a configuration to relax the electric field stresses at the interface between the channel region and its outside when desired voltages are applied to the gate electrode 104 to cause current to flow through the channel. Specifically, the semiconductor device 100 according to an embodiment has a region (the first region 120*a* and the second region 120*b*) having a thick gate insulating film and a region (the third region 120*c*) having a thin gate insulating film between the first terminal 108 and the second terminal 110, and the thickness of the gate insulating film in the first region 120*a* and the second region 120*b* is thicker than the thickness of the gate insulating film for the semiconductor film 112 in the third region 120*c*, as described above. Thus, in the second region 120*b*, the electric field between the gate electrode 104 and the second terminal 110 is relaxed. As a result, even if desired voltages are applied to each of the gate electrode 104, the first terminal 108, and the second terminal 110, the AC-stress degradation in the vicinity of the channel in the second region 120*b*, i.e., the AC-stress degradation in between the second terminal 110 and the channel of the semiconductor film, can be suppressed without sacrificing the channel resistance of the channel in the third region 120*c*.

When the first terminal 108 and the second terminal 110 are respectively a drain electrode and a source electrode, the first terminal 108 is supplied with a signal that changes from a high voltage to a low voltage (equal to or higher than the voltage applied to the second terminal), or from a low voltage to a high voltage. On the other hand, for example, a constant voltage such as GND, the common voltage, and 0V is supplied to the second terminal 110. When periodic signals are supplied to the first terminal 108 serving as a drain electrode and a current flows through the channel of the semiconductor film, degradation easily progresses particularly between the first terminal 108 and the channel of the semiconductor film. At this time, the semiconductor device 100 according to an embodiment has a configuration to relax the electric field stresses at the interface between the channel region and its outside. Specifically, the semiconductor device 100 according to an embodiment has a region (the first region 120*a* and the second region 120*b*) having a thick gate insulating film and a region (the third region 120*c*) having a thin gate insulating film between the first terminal 108 and the second terminal 110, and the thickness of the gate insulating film in the first region 120*a* and the second region 120*b* is thicker than the thickness of the gate insulating film for the semiconductor film 112 in the third region 120*c*, as described above. Thus, in the first region 120*a*, the electric field between the gate electrode 104 and the first terminal 108 is relaxed. As a result, even if desired voltages are applied to each of the gate electrode 104, the first terminal 108, and the second terminal 110, the AC-stress degradation in the vicinity of the channel in the first region 120*a*, that is, between the first terminal 108 and the channel of the semiconductor film can be suppressed without sacrificing the channel resistance of the channel in the third region 120*c*.

Similar to the configuration described above, even when the drain electrode and the source electrode are interchanged with each other, it is possible to relax the electric field of the drain terminal side by lowering the absolute value of the potential of the gate electrode on the side of the electrode serving as a drain electrode than the absolute value of the potential at gate electrode serving as a source electrode, can be relaxed. Accordingly, the AC-stress degradation is suppressed, and the reduction of the long-term reliability of the semiconductor device 100 can be suppressed.

<1-2. Manufacturing Methods of Semiconductor Device 100>

FIG. 2A, FIG. 2B, FIG. 2C and FIG. 2D are cross-sectional views showing manufacturing methods of the semiconductor device 100 according to an embodiment. FIG. 3 is a flow chart showing a manufacturing method of the semiconductor device 100 according to an embodiment. Descriptions of the same structures as those in FIGS. 1A and 1B may be omitted. Manufacturing methods of the semiconductor device 100 according to an embodiment are not limited to the structures shown in FIG. 2A, FIG. 2B, FIG. 2C, FIG. 2D, and FIG. 3. In the manufacturing process of the semiconductor device 100 according to an embodiment, known techniques commonly used in the technical field of the present invention can be used for forming films, layers, configurations, materials of respective member, and the like. For example, the semiconductor device 100 according to an embodiment is formed by applying a manufacturing process of liquid crystal display device, a manufacturing process of EL (electroluminescence) display device, which is a known art, or a manufacturing technique applied in a manufacturing process of a semiconductor device.

Figure 2A:
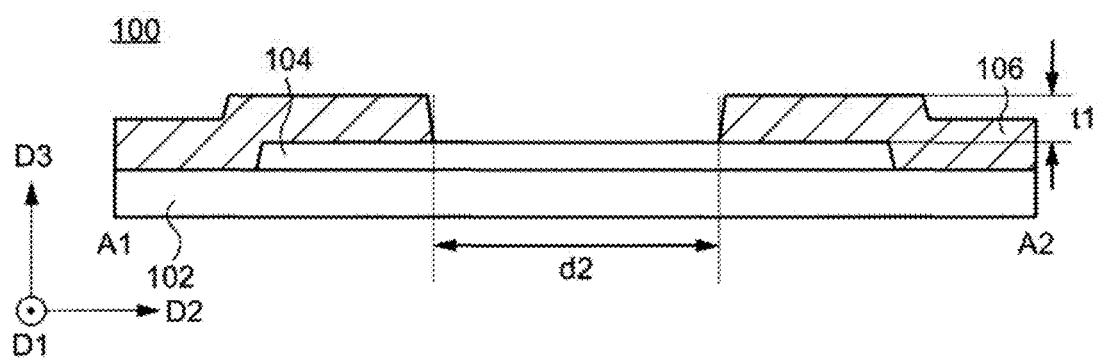
FIG. 2A is a cross-sectional view showing a manufacturing method of a semiconductor device according to an embodiment.

First, as shown in FIG. 2A and FIG. 3, when the production of the semiconductor device 100 is started, the first gate insulating film 106 is formed over the gate electrode 104 formed over the substrate 102 (step 31 (S31)). The materials forming the gate electrode 104 include, for example, metals such as titanium, molybdenum, tungsten, tantalum, copper, aluminum, and the like, or alloys containing at least one metal selected from these metals. The structure of the gate electrode 104 may be a single-layer structure including the aforementioned metal or the like, or may be a stacked structure including the aforementioned metal or the like. As a method for forming the gate electrode 104, a sputtering method, a chemical vapor deposition (CVD) method, or the like can be applied. The gate electrode 104 is also formed by photolithography techniques, for example, using a photomask to form the gate electrode 104.

The thickness of the first gate insulating film 106 is the thickness t1. Materials forming the first gate insulating film 106 include, for example, a silicon-containing inorganic compound such as silicon nitride, silicon oxide, silicon oxynitride, silicon nitride oxide, and the like. The first gate insulating film 106 may be composed of a single film containing the aforementioned inorganic compound, or may be composed of a stack of a plurality of films containing the aforementioned inorganic compound. As a method for forming the first gate insulating film 106, for example, a sputtering method, a CVD method, or the like can be applied similarly to the method for forming the gate electrode 104.

The first gate insulating film 106 is provided to have the margin d4 to the first terminal 108 and is provided to have the margin d3 to the second terminal 110. The length between the first gate insulating film 106 is the length d2. In an embodiment of the semiconductor device 100, the first gate insulating film 106 is formed by photolithography techniques using, for example, a photomask same to the photomask for forming the first terminal 108 and the second terminal 110. When the first gate insulating film 106 is formed using a photomask same to the photomask for forming the first terminal 108 and the second terminal 110, the number of photomasks used in manufacturing the semiconductor device 100 can be reduced. At this time, the margins d3 and d4 can be ensured based on the overetching amount at the time of patterning, for example, the first terminal 108 and second terminal 110 to be formed later.

The dielectric constant of the first gate insulating film 106 may be less than the dielectric constant of the second gate insulating film 116. This makes it possible to reduce the parasitic capacitance between the gate electrode 104 and the first terminal 108 and the second terminal 110. By reducing the parasitic capacitance between the gate electrode 104 and the first terminal 108 and the second terminal 110, when applying a desired voltage to each of the gate electrode 104, the first terminal 108, and the second terminal 110, the electric field between the gate electrode 104 and the first terminal 108 and the second terminal 110 can be further relaxed. Therefore, even if desired voltages are applied to each of the second terminal 110, the AC-stress degradation in the vicinity of the channel in the first region 120a, i.e., the AC-stress degradation in an end part of the first terminal 108 serving as a drain electrode can be further suppressed without sacrificing the channel resistance of the channel in the third region 120c.

Figure 2B:
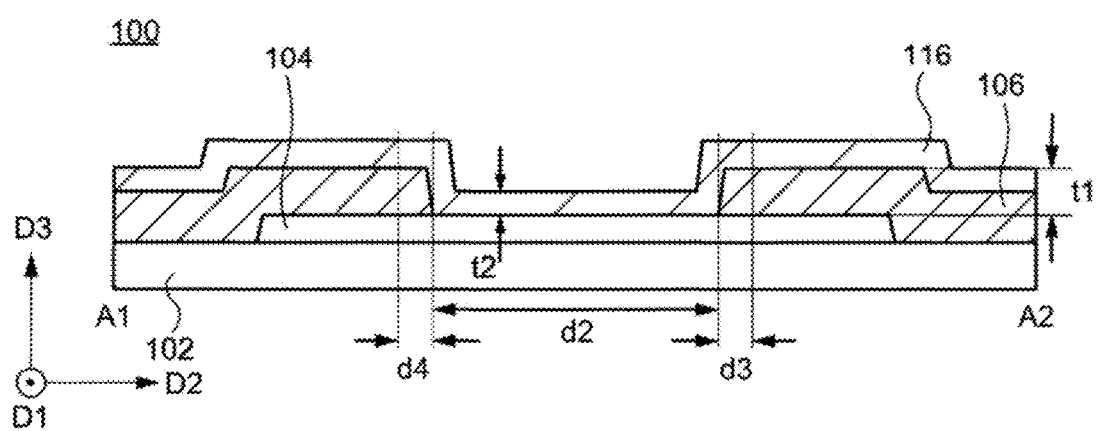
FIG. 2B is a cross-sectional view showing a manufacturing method of a semiconductor device according to an embodiment.

Subsequently, as shown in FIG. 2B and FIG. 3, the second gate insulating film 116 is formed (step 33 (S33)). The thickness of the second gate insulating film 116 is the thickness t2. The same material, forming method, and configuration as those of the first gate insulating film 106 can be applied to the material fro forming the second gate insulating film 116, the forming method, and the configuration of the second gate insulating film 116. When the semiconductor film 112 includes an oxide semiconductor, it is preferable that the layer in contact with the semiconductor film 112 in the second gate insulating film 116 is a film containing silicon oxide. Thus, it is possible to suppress impurities which can be a carrier source such as hydrogen from entering the semiconductor film 112 from the second gate insulating film 116. As a result, it is possible to suppress the generation of a level caused by an impurity in the semiconductor film 112. As another inorganic compound, a so-called high-k material such as hafnium oxide or yttrium oxide may be used for the second gate insulating film 116. The material forming the first gate insulating film 106 and the second gate insulating film 116, the forming method, and the configuration may be the same or different. For example, the second gate insulating film 116 may be formed over the entire surface of the substrate 102 without using a photomask, or may be formed to overlap and cover the semiconductor film 112 over the substrate 102 using a photomask.

Figure 2C:
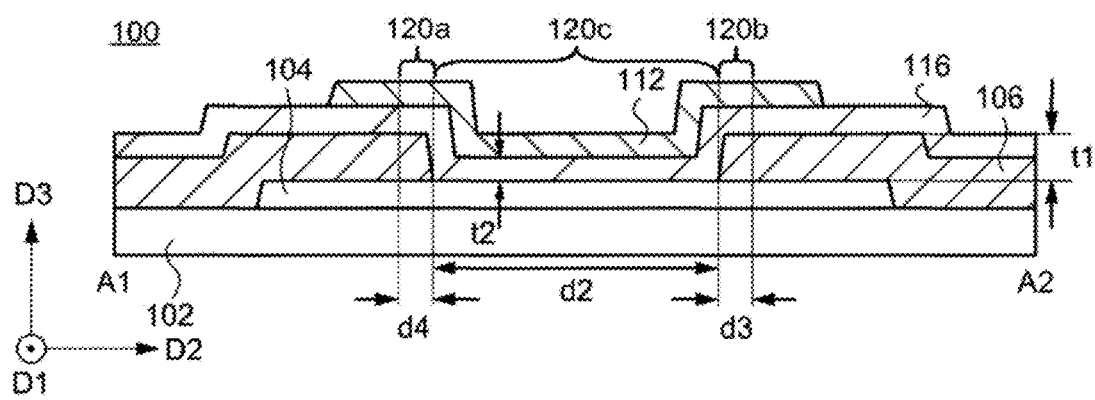
FIG. 2C is a cross-sectional view showing a manufacturing method of a semiconductor device according to an embodiment.

Subsequently, as shown in FIG. 2C and FIG. 3, the semiconductor film 112 is formed (step 35 (S35)). The material forming the semiconductor film 112 may contain, for example, the Group 14 element such as silicon or germanium, and may include an oxide semiconductor. The oxide semiconductor may contain the Group 13 element such as indium or gallium, for example, a mixed oxide of indium and gallium (IGO), a mixed oxide containing indium, gallium, and zinc (IGZO). The oxide semiconductor may contain tin, titanium, zirconium, and the like. As a method for forming the semiconductor film 112, for example, a method similar to the method for forming the gate electrode 104 can be applied.

Figure 2D:
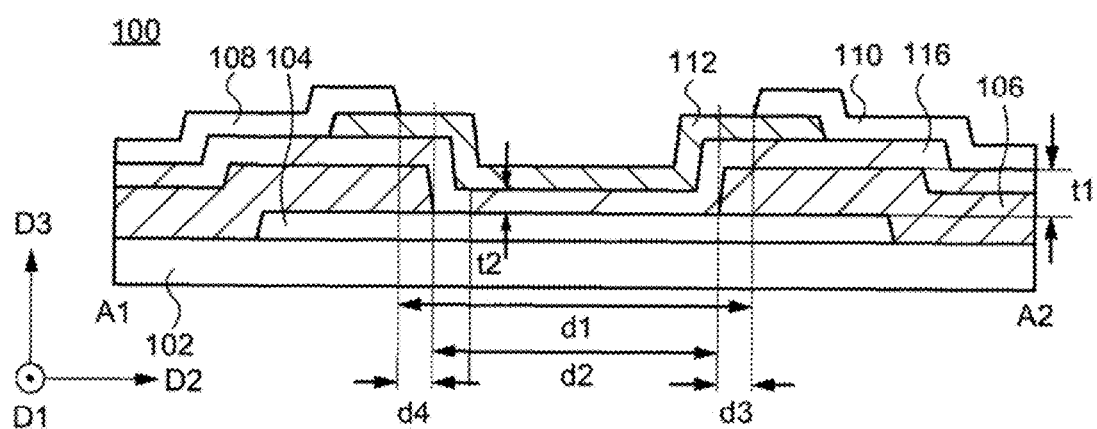
FIG. 2D is a cross-sectional view showing a manufacturing method of a semiconductor device according to an embodiment.

Subsequently, as shown in FIG. 2D and FIG. 3, the first terminal 108 and the second terminal 110 are formed (step 37 (S37)). The materials forming the first terminal 108 and the second terminal 110 may be selected from materials similar to those listed in forming the gate electrode 104. The first terminal 108 and the second terminal 110 can be formed in the same process at the same time so as to exist on the same surface as the upper surface of the second gate insulating film 116 on which the semiconductor film 112 is provided, and on the upper surface and the side surface of the semiconductor film 112.

The first terminal 108 and the second terminal 110 are formed by photolithographic techniques using the photomask to form the first terminal 108 and the second terminal 110. When the first terminal 108 and the second terminal 110 are formed, for example, by applying a dry-etching technique, the end part of the first terminal 108 is formed at a margin d4 away from the end part of the first gate insulating film 106 of the first terminal 108. The end part of the second terminal 110 is formed at a margin d3 away from the end part of the first gate insulating film 106 of the second terminal 110. Also, the length between the first terminal 108 and the second terminal 110 is the length d1. The length d1 is longer than the length d2.

As described above, in the semiconductor device 100 according to an embodiment, the gate insulating film is formed in two steps of forming the first gate insulating film 106 and forming the second gate insulating film 116. The first gate insulating film 106, the first terminal 108, and the second terminal 110 are formed using the same photomask in different steps. The semiconductor device 100 according to an embodiment may define three regions (the first region 120a, the second region 120b, and the third region 120c) sandwiched between the first terminal 108 and the second terminal 110 in the semiconductor film 112 by the manufacturing method of the semiconductor device 100 according to an embodiment. The thickness of the gate insulating film in the first region 120a and the second region 120b may be thicker than the thickness of the gate insulating film to the semiconductor film 112 in the third region 120c. Thus, when desired voltages are applied to each of the gate electrode 104, the first terminal 108, and the second terminal 110, the electric field strength between the first terminal 108 in the vicinity of the first region 120a and the gate electrode 104 and the electric field strength between the second terminal 110 in the vicinity of the second region 120b and the gate electrode 104 may be lower than the electric field strength between the third region 120c and the semiconductor film 112, and the electric field strength between the semiconductor film 112 and the gate electrode 104 in the third region 120c may be larger than the electric field strength of the first region 120a and the second region 120b. As a result, the semiconductor device 100 according to an embodiment can supply enough current to the channels and can relax the electric field between the first terminal 108 and the second terminal 110 and the gate electrode 104, thereby suppressing the degradation of the characteristics of the semiconductor device 100.

<1-3. Modifications of Semiconductor Device 100>

Figure 4A:
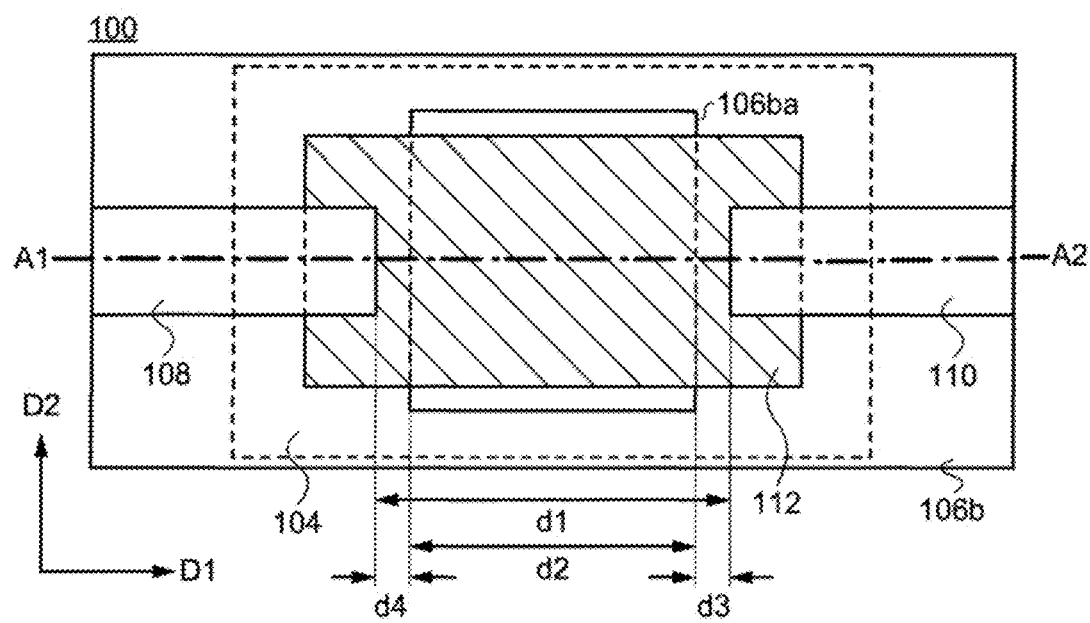
FIG. 4A is a top view showing a configuration of a semiconductor device according to an embodiment.
Figure 4B:
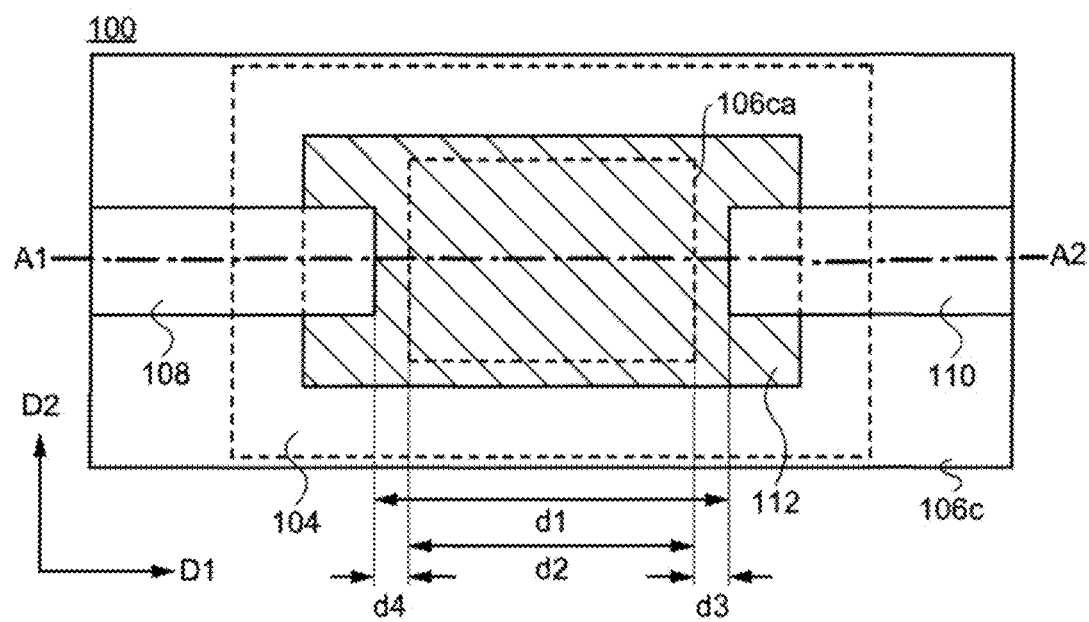
FIG. 4B is a top view showing a configuration of a semiconductor device according to an embodiment.

FIG. 4A and FIG. 4B are top view showing the first modification and the second modification of the semiconductor device 100 according to an embodiment. Descriptions of the same configurations as those of FIGS. 1A to 3 may be omitted. The modifications 1 and 2 of the semiconductor device 100 according to an embodiment are not limited to the configurations shown in FIGS. 4A and 4B. Cross-sectional views along A1-A2 line in FIGS. 4A and 4B are the same as in FIG. 1B.

The first modification of the semiconductor device 100 shown in FIG. 4A differs from the configuration of the semiconductor device 100 shown in FIG. 1A in that the first gate insulating film is formed using a dedicated photomask. Therefore, in the explanation of the first modification of the semiconductor device 100 shown in FIG. 4A, points different from the configuration of the semiconductor device 100 shown in FIG. 1A will be mainly described.

In the first modification of the semiconductor device 100 shown in FIG. 4A, a first gate insulating film 106b has an opening 106ba. The opening 106 ba is a region in which the first gate insulating film 106b is not provided. That is, the first gate insulating film 106b is not formed on a part of the semiconductor film 112 and a part of the gate electrode 104. A region in which the first gate insulating film 106b is not provided is the third region 120c.

In the second modification of the semiconductor device 100 shown in FIG. 4B, a first gate insulating film 106c has an opening 106ca. The opening 106ca is a region in which the first gate insulating film 106b is not provided. That is, the first gate insulating film 106b is not formed on a part of the semiconductor film 112. A region in which the first gate insulating film 106c is not provided is the third region 120c, as in the region in which the first gate insulating film 106b is not provided.

In the first modification and the second modification of the semiconductor device 100 according to an embodiment, the first gate insulating film is formed using a dedicated photomask. Since the first gate insulating film can be formed using a dedicated photomask, the margin d4 for the first terminal 108 of the first gate insulating film and the margin d3 for the second terminal 110 of the first gate insulating film can be set considering the designed tolerances. The lengths of the first region 120a, the second region 120b, and the third region 120c can be adjusted according to the application, specifications, and the like of the semiconductor device 100. Therefore, in the semiconductor device 100 according to the present embodiment, each of the electric field between the first terminal 108 and the gate electrode 104, and the electric field between the second terminal 110 and the gate electrode 104 can be controlled independently. Therefore, in the semiconductor device 100, the AC-stress degradation, particularly the AC-stress degradation on terminal side that functions as the drain electrode, can be effectively suppressed. As a result, by using the semiconductor device 100, it is possible to provide a highly reliable semiconductor device.

As in the first modification and the second modification of the semiconductor device 100 according to an embodiment, when the first gate insulating film is formed using a dedicated photomask (a separate photomask) and the source electrode or the drain electrode of the semiconductor device 100 is fixed to the first terminal 108 or the second terminal 110 without being replaced each other, the thickness of the gate insulating film may be formed to be long (thick) only in the vicinity of the end of a terminal serving as the drain electrode.

Figure 5A:
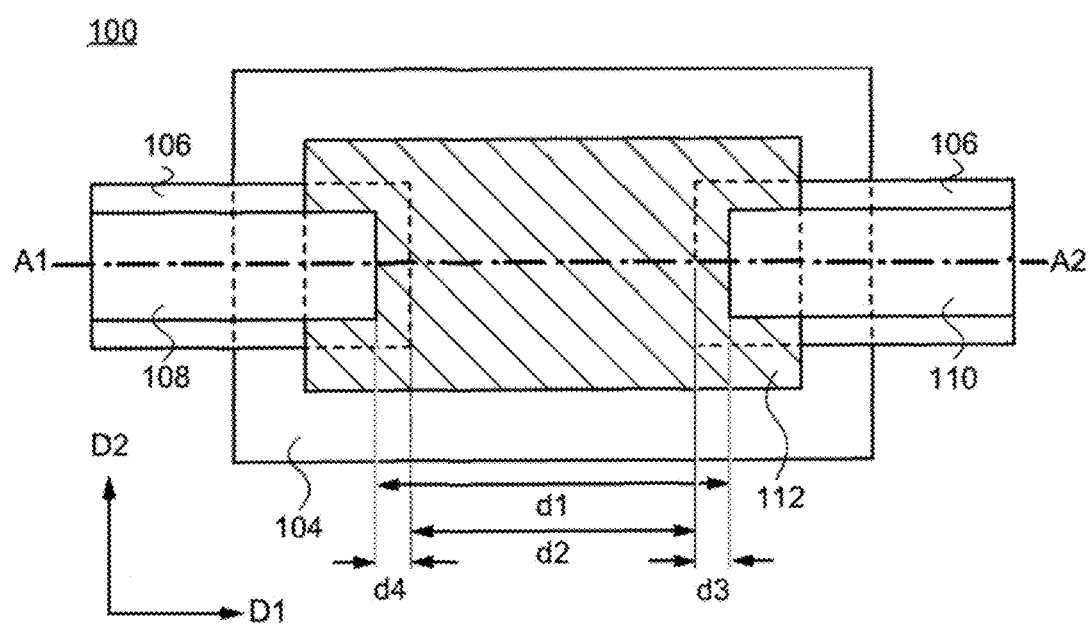
FIG. 5A is a top view showing a configuration of a semiconductor device according to an embodiment.
Figure 5B:
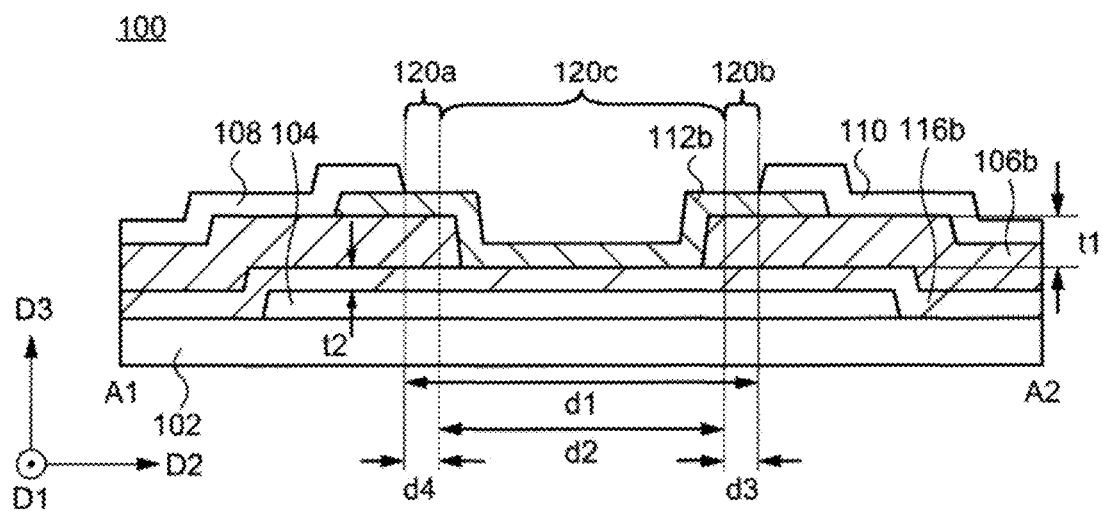
FIG. 5B is a cross-sectional view showing a configuration of a semiconductor device according to an embodiment.

FIG. 5A is a top view showing the third modification of the semiconductor device 100 according to an embodiment, and FIG. 5B is a cross-sectional view along A1-A2 line of the third modification of the semiconductor device 100 according to an embodiment shown in FIG. 5A. Descriptions of the same structures as those of FIGS. 1A to 4B are omitted in some cases. The third modification of the semiconductor device 100 according to an embodiment is not limited to the configuration shown in FIGS. 5A and 5B.

The third modification of the semiconductor device 100 shown in FIGS. 5A and 5B differs from the configuration of the semiconductor device 100 shown in FIGS. 1A and 1B in the order of stacking in the third direction D3 of the first gate insulating film 106b and a second gate insulating film 116b. In the manufacturing method shown in FIG. 3, the order of step S31 and step S33 is switched to each other. Therefore, in the explanation of the third modification of the semiconductor device 100 shown in FIG. 5A, points different from the configuration of the semiconductor device 100 shown in FIG. 1A will be mainly described.

In the third modification of the semiconductor device 100 shown in FIGS. 5A and 5B, the first gate insulating film 106b is formed after the second gate insulating film 116b is formed. The second gate insulating film 116b is provided over the substrate 102 and the gate electrode 104 and covers the gate electrode 104. Specifically, the second gate insulating film 116b overlaps and covers the side surface and the upper surface of the gate electrode 104. The first gate insulating film 106b is provided over the second gate insulating film 116. Specifically, the first gate insulating film 106b overlaps and covers a part of the side surface and a part of the upper surface of the first gate insulating film 106b. Subsequently, a semiconductor film 112b is formed. The semiconductor film 112b is provided over the second gate insulating film 116b and the first gate insulating film 106b, and covers a part of the second gate insulating film 116b and a part of the first gate insulating film 106b. In particular, the semiconductor film 112b overlaps and covers a part of the upper surface of the second gate insulating film 116b and a part of the side surface and a part of the upper surface of the first gate insulating film 106b.

Although a detailed description is omitted here, the descriptions of the first region 120a, the second region 120b, and the third region 120c shown in FIG. 5B can be described by replacing the semiconductor film 112, the first gate insulating film 106, and the second gate insulating film 116 described in FIGS. 1A to 4B with the semiconductor film 112b, the first gate insulating film 106b, and the second gate insulating film 116b.

If the first gate insulating film 106b is formed after the second gate insulating film 116b is formed, the thickness of the second gate insulating film 116b may be thicker than the thickness of the first gate insulating film 106b.

As described above, in the semiconductor device 100 according to the embodiment, the stacking order of the first gate insulating film 106b and the second gate insulating film 116b in the third direction D3 may be different from each other.

In the present embodiment, the process of forming the gate insulating film by dividing it into two layers has been mainly described, but the present invention is not limited thereto. Although not shown in particular, for example, after the gate electrode 104 is formed, the gate insulating film is formed in advance on the entire surface so that the film thickness thereof becomes the thickness t1+the thickness t2, and thereafter, only a region corresponding to the third region 120c may be subjected to a thinning (thin film) process. In an embodiment, the claims, and in the drawings, a region where the film thickness of the gate insulating film is the thickness t1+the thickness t2 may be referred to as a first film thickness region, and a region where the film thickness of the gate insulating film is subjected to a thinning (thin film) process may be referred to as a second film thickness region.

2. Second Embodiment

Figure 6:
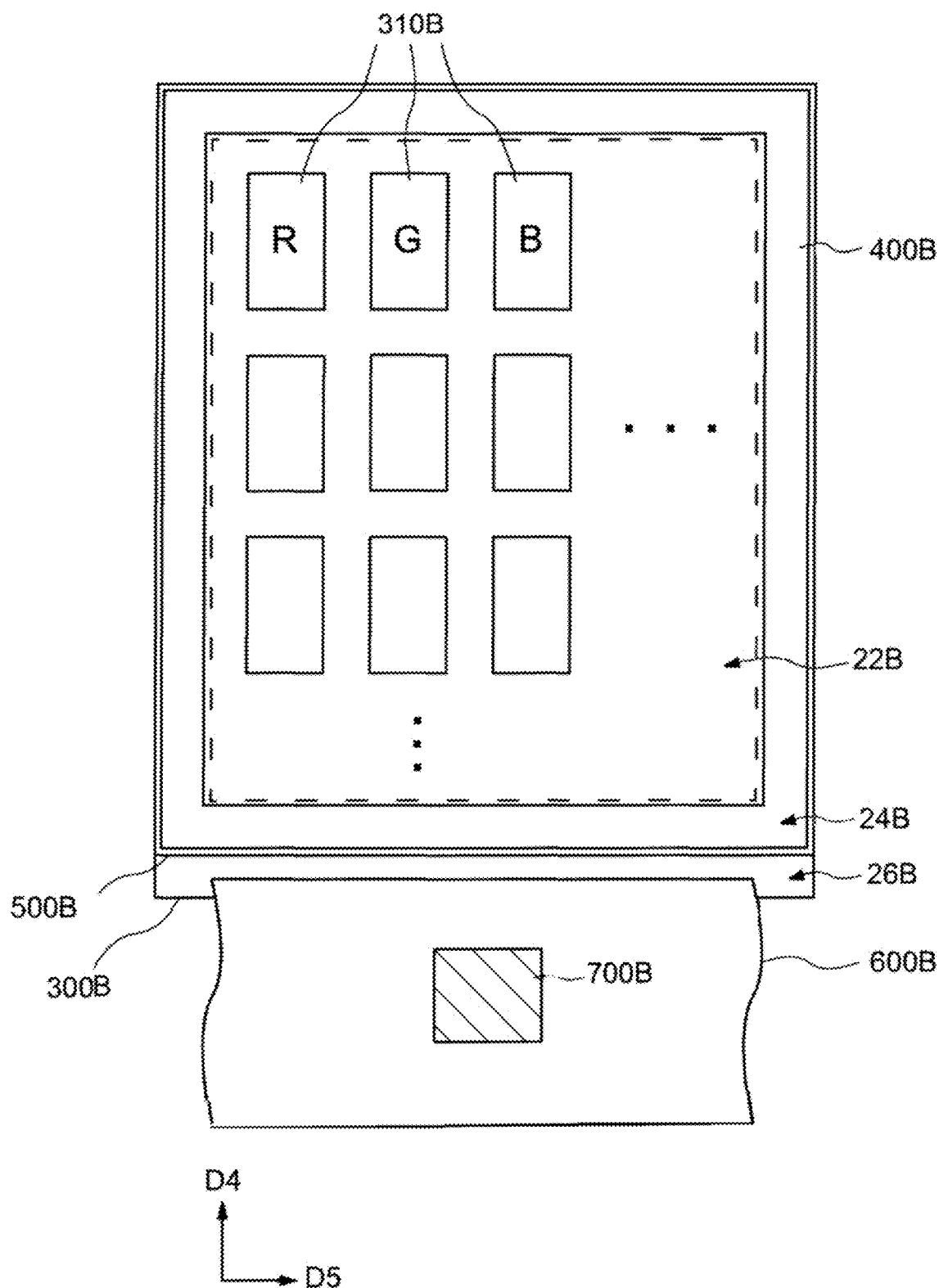
FIG. 6 is a top view showing a configuration of a display device according to an embodiment.
Figure 7:
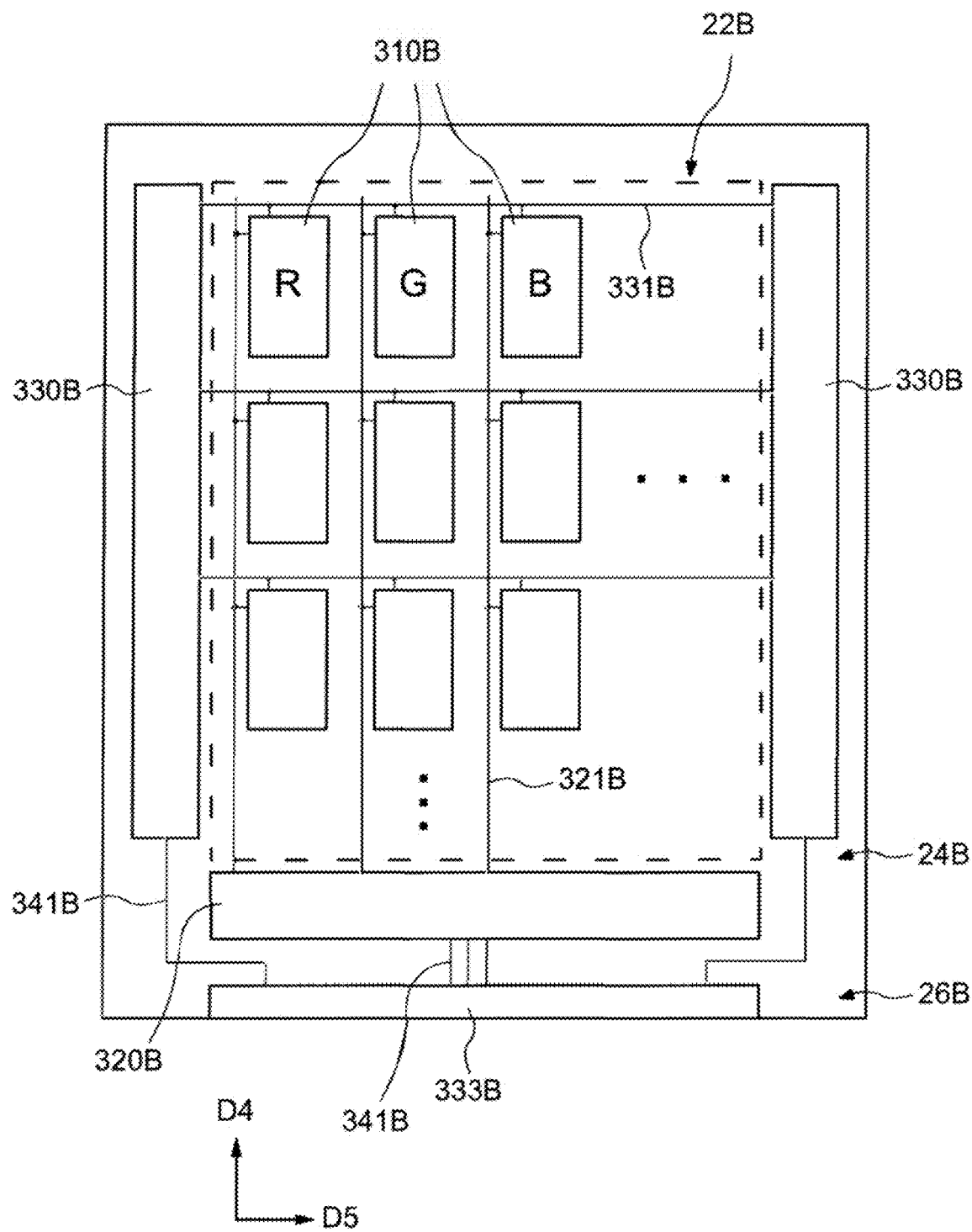
FIG. 7 is a top view showing a configuration of a display device according to an embodiment.
Figure 8:
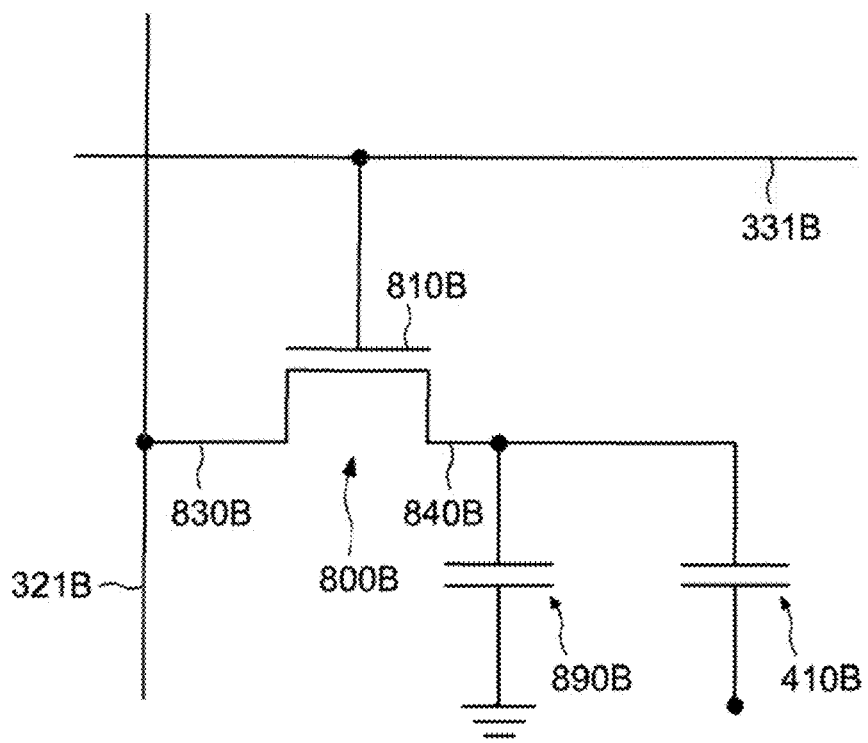
FIG. 8 is an equivalent circuit diagram showing a configuration of pixels of a display device according to an embodiment.
Figure 9:
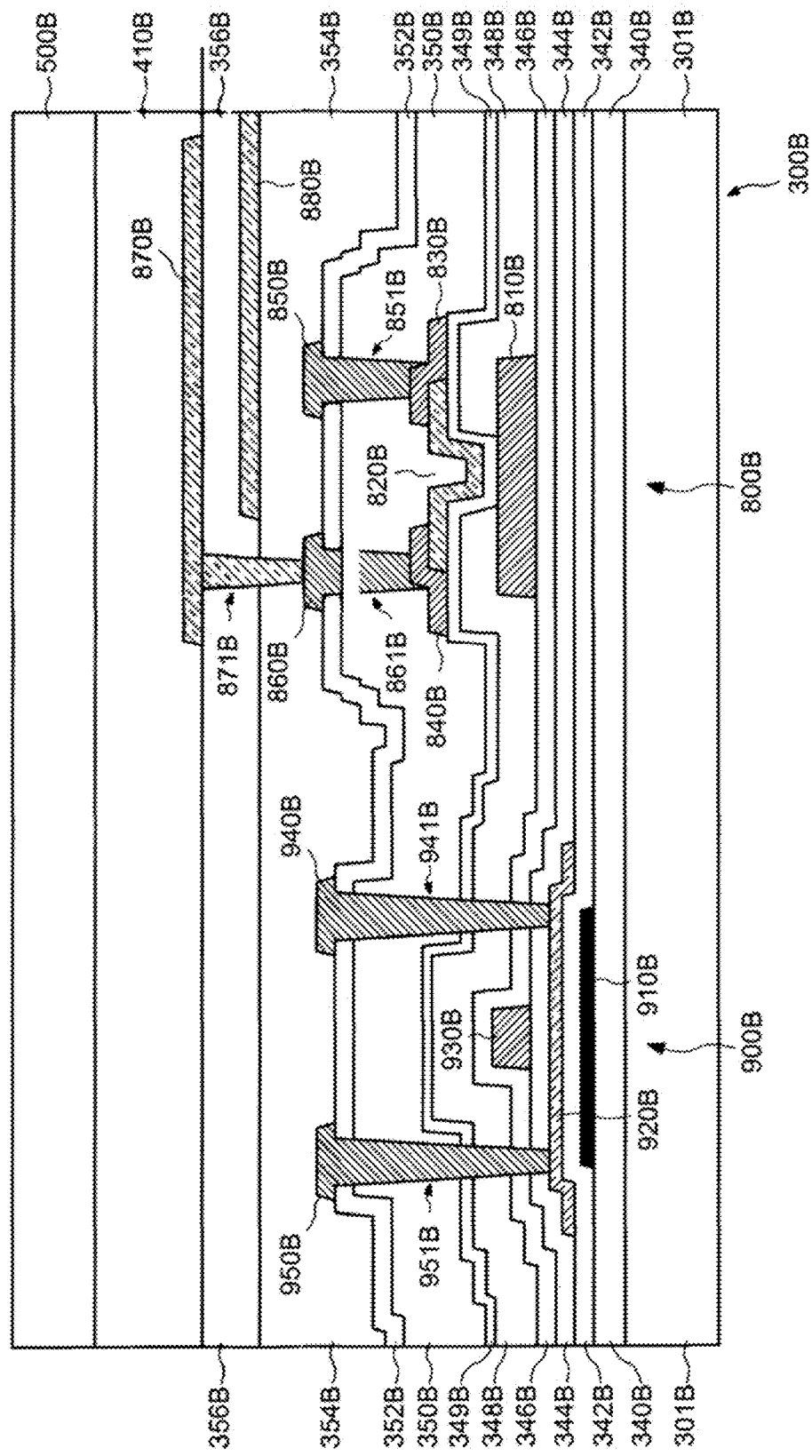
FIG. 9 is a cross-sectional view showing a configuration of a display device according to an embodiment.

In the present embodiment, a display device 20B using the semiconductor device 100 according to an embodiment will be described. In the present embodiment, a configuration in which the semiconductor device described in the first embodiment is applied to a transistor constituting a pixel of a liquid crystal display device will be rescribed. FIG. 6 is a top view showing a configuration of the display device 20B according to an embodiment. FIG. 7 is a top view showing a configuration of the display device 20B according to an embodiment. FIG. 8 is an equivalent circuit diagram showing the configuration of a pixel 310B of the display device 20B according to an embodiment. FIG. 9 is a cross-sectional view showing a configuration of the display device 20B according to an embodiment. FIG. 10 is a top view showing a pixel electrode and a common electrode of the display device 20B according to an embodiment. Descriptions of the same structures as those of FIGS. 1A to 5B are omitted in some cases. The display device 20B using the semiconductor device 100 according to an embodiment is not limited to the configuration shown in FIGS. 6 to 10.

<2-1. Outline of Display Device 20B>

As shown in FIG. 6, the display device 20B has an array substrate 300B, a seal part 400B, an opposite substrate 500B, a flexible printed circuit substrate 600B (FPC600B), and an IC chip 700B. The array substrate 300B and the opposite substrate 500B are bonded by the seal part 400B. In a liquid crystal area 22B surrounded by the seal part 400B, a plurality of pixels 310B are arranged in a matrix. The liquid crystal area 22B is a region that overlaps with a liquid crystal element 410B in a planar view to be described later.

A seal area 24B that overlaps the seal part 400B an a plan view is a region around the liquid crystal area 22B. The FPC600B is provided in a terminal area 26B. The terminal area 26B is a region where the array substrate 300B is exposed from the opposite substrate 500B and is provided on the outside of the seal area 24B. The outside of the seal area 24B means the outside of a region surrounded by the seal part 400B. The IC chip 700B is provided on the FPC600B. The IC chip 700B provides a signal for driving each pixel 310B.

<2-2. Circuit Configuration of Display Device 20B>

As shown in FIG. 7, a source driver circuit 320B and a gate driver circuit 330B are provided at a position adjacent to the liquid crystal area 22B in which the pixels 310B are arranged. The source driver circuit 320B is provided in the D4 direction (column direction). The gate driver circuit 330B is provided in the D5 direction (row direction). The source driver circuit 320B and the gate driver circuit 330B are provided in the seal area 24B described above.

As shown in FIG. 7, the arrangement of the plurality of pixels 310B is, for example, a stripe arrangement. Each of the plurality of pixels 310B may correspond to, for example, the sub-pixel R, the sub-pixel G, the sub-pixel B. One pixel may be formed by three sub-pixels. The pixel 310B is the smallest unit constituting a part of the image to be reproduced by the liquid crystal area 22B. Each sub-pixel is equipped with one display element. In the example shown in FIG. 6, the display element is the liquid crystal element 410B. The color corresponding to the sub-pixel is determined by the characteristics of the liquid crystal element 410B or a color filter provided on the sub-pixel (not shown).

In the stripe arrangement, the sub-pixel R, the sub-pixel G, and the sub-pixel B can be configured to give different colors. For example, each of the sub-pixel R, the sub-pixel G, the sub-pixel B may be provided with a color filter layer that emits the three primary colors of red, green, blue. Then, any voltage or current is supplied to each of the three sub-pixels, the display device 20B can display an image.

A source wiring 321B extends in the D4 direction from the source driver circuit 320B and is connected to the plurality of pixels 310B arranged in the D4 direction. A gate wiring 331B extends in the D5 direction from the gate driver circuit 330B and is connected to the plurality of pixels 310B arranged in the D5 direction.

A terminal part 333B is provided in the terminal area 26B. The terminal part 333B and the source driver circuit 320B are connected by a connection wiring 341B. Similarly, the terminal part 333B and the gate driver circuit 330B are connected by the connection wiring 341B. By the FPC600B is connected to the terminal part 333B, an external device to which the FPC600B is connected and the display device 20B are connected, and a signal from the external device drives each pixel 310B provided in the display device 20B.

<2-3. Pixel 310B of Display Device 20B>

As shown in FIG. 8, the pixel 310B includes for example, a transistor 800B, a storage capacitor 890B, and elements such as the liquid crystal element 410B. The transistor 800B includes a gate electrode 810B, a source electrode 830B, and a drain electrode 840B. The gate electrode 810B is connected to the gate wiring 331B. The source electrode 830B is connected to the source wiring 321B. The drain electrode 840B is connected to the storage capacitor 890B and the liquid crystal element 410B. The semiconductor device 100 according to an embodiment is applied to the transistor 800B constituting the pixel 310B. In the present embodiment, for convenience of explanation, 830B is referred to as the source electrode, the drain electrode 840B is referred to as the drain electrode. The source electrode 830B is the first terminal 108, and the drain electrode 840B is the second terminal 110. The drain electrode and the source electrode may be switched to each other, and the function as a source and a drain of each electrode may be interchanged with each other.

<2-4. Cross-Sectional Structure of Display Device 20B>

As shown in FIG. 9, the display device 20B is a display device in which the transistors 800B and 900B having differing structures are provided on the same substrate. The structure of the transistor 800B is different from that of the transistor 900B. Specifically, the transistor 800B is a bottom-gate transistor in which an oxide semiconductor is used as a semiconductor film 820B. The transistor 900B is a top-gate transistor using the Group 14 element as a semiconductor film 920B. For example, the transistor 800B is used for the pixel 310B, the transistor 900B is used for the source driver circuit 320B and the gate driver circuit 330B.

The transistor 800B is a transistor formed in a substrate 301B, and is a transistor having an insulating layer 340B, an insulating layer 342B, an insulating layer 344B, and an insulating layer 346B as the under layer. The gate electrode 810B is provided on the insulating layer 346B. The semiconductor film 820B is provided above the gate electrode 810B. The gate electrode 810B is opposed to the semiconductor film 820B. Between the gate electrode 810B and the semiconductor film 820B, an insulating layer 348B which functions as the first gate insulating film and an insulating layer 349B which functions as the second gate insulating film are provided. The source electrode 830B is provided on one end part of the pattern of the semiconductor film 820B, the drain electrode 840B is provided on the other end portion. The source electrode 830B and the drain electrode 840B are connected to the semiconductor film 820B on the upper surface and the side surfaces of the semiconductor film 820B, respectively.

The insulating layer 348B and the insulating layer 349B are laminated between the semiconductor film 820B and the gate electrode 810B. The area includes a region (the first region and the second region) in which the gate insulating film is thick (long), and a region (the third region) in which only the insulating layer 348B is provided. The transistor 800B is a transistor formed in the substrate 301B, and is a transistor having the insulating layer 340B, the insulating layer 342B, the insulating layer 344B, and the insulating layer 346B as the under layer. The gate electrode 810B is provided on the insulating layer 346B. The semiconductor film 820B is provided above the gate electrode 810B. The gate electrode 810B is opposed to the semiconductor film 820B. Between the gate electrode 810B and the semiconductor film 820B, the insulating layer 348B which functions as the first gate insulating film and the insulating layer 349B which functions as the second gate insulating film are provided. The source electrode 830B is provided on one end part of the pattern of the semiconductor film 820B, the drain electrode 840B is provided on the other end portion. The source electrode 830B and the drain electrode 840B are connected to the semiconductor film 820B on the upper surface and the side surfaces of the semiconductor film 820B, respectively.

An insulating layer 350B and an insulating layer 352B are provided over the semiconductor film 820B, the source electrode 830B and the drain electrode 840B. The insulating layer 350B and the insulating layer 352B are provided with opening 851B and an opening 861B. A sourcing wiring 850B is provided over the insulating layer 352B and inside the opening 851B. A drain wiring 860B is provided over the insulating layer 352B and inside the opening 861B.

An insulating layer 354B is provided over the source wiring 850B and the drain wiring 860B. Above the insulating layer 354B, a common electrode 880B provided in common to a plurality of pixels is provided. An insulating layer 356B is provided above the common electrode 880B. The insulating layer 354B and the insulating layer 356B are provided with an opening 871B. A pixel electrode 870B is provided over the insulating layer 356B and inside the opening 871B.

As shown in FIG. 10, in a plan view, the common electrode 880B has an overlapping region overlapping the pixel electrode 870B and a non overlapping region that does not overlap the pixel electrode 870B. When a voltage is supplied between the pixel electrode 870B and the common electrode 880B, a transverse electric field is formed from the pixel electrode 870B toward the common electrode 880B of the non overlapping region. The lateral electric field operates the liquid crystal molecules contained in the liquid crystal element 410B, and the gradation to be displayed on the pixel is determined.

The transistor 900B is a transistor formed in the substrate 301B, and is a transistor having the insulating layer 340B as the under layer. A light-shielding layer 910B is provided above the insulating layer 340B. The insulating layer 342B is provided over the light-shielding layer 910B. The semiconductor film 920B is provided over the insulating layer 342B. A gate electrode 930B is provided over the semiconductor film 920B. Between the semiconductor film 920B and the gate electrode 930B, the insulating layer 344B which functions as the gate insulating film is provided. The insulating layer 346B, the insulating layer 348B, the insulating layer 350B, and the insulating layer 352B are provided over the gate electrode 930B. These insulating layer are provided with an opening 941B, and an opening 951B. A sourcing wiring 940B is provided over the insulating layer 352B and inside the opening 941B. A drain wiring 950B is provided over the insulating layer 352B and inside the opening 951B. The insulating layer 354B is provided over the source wiring 940B and the drain wiring 950B.

In the present embodiment, applying the third modification of the semiconductor device 100 shown in FIG. 5A and FIG. 5B, the gate insulating layer 349B functioning as the second gate insulating film is formed first, and then the insulating layer 348B functioning as the first gate insulating film is formed, and the stacking order of the insulating layer 348B functioning as the first gate insulating film and the insulating layer 349B functioning as the second gate insulating film may be different.

As described in the first embodiment, when the pixel is operated, that is, when a current flows through the channels of the semiconductor film 820B, the AC-stress degradation of the semiconductor film 820B becomes remarkable at the end part of the drain electrode 840B. In the display device 20B, the construction of the gate insulating film between the drain electrode 840B and the gate electrode 810B is a stacked structure of the insulating layer 348B and the insulating layer 349B. With this structure, it is possible to relax the electric field between the drain electrode 840B and the gate electrode 810B, and it is possible to suppress the AC-stress degradation of the semiconductor film 820B at the end part of the drain electrode 840B. As a result, deterioration of characteristics of the transistor 800B is suppressed.

3. Third Embodiment

Figure 11:
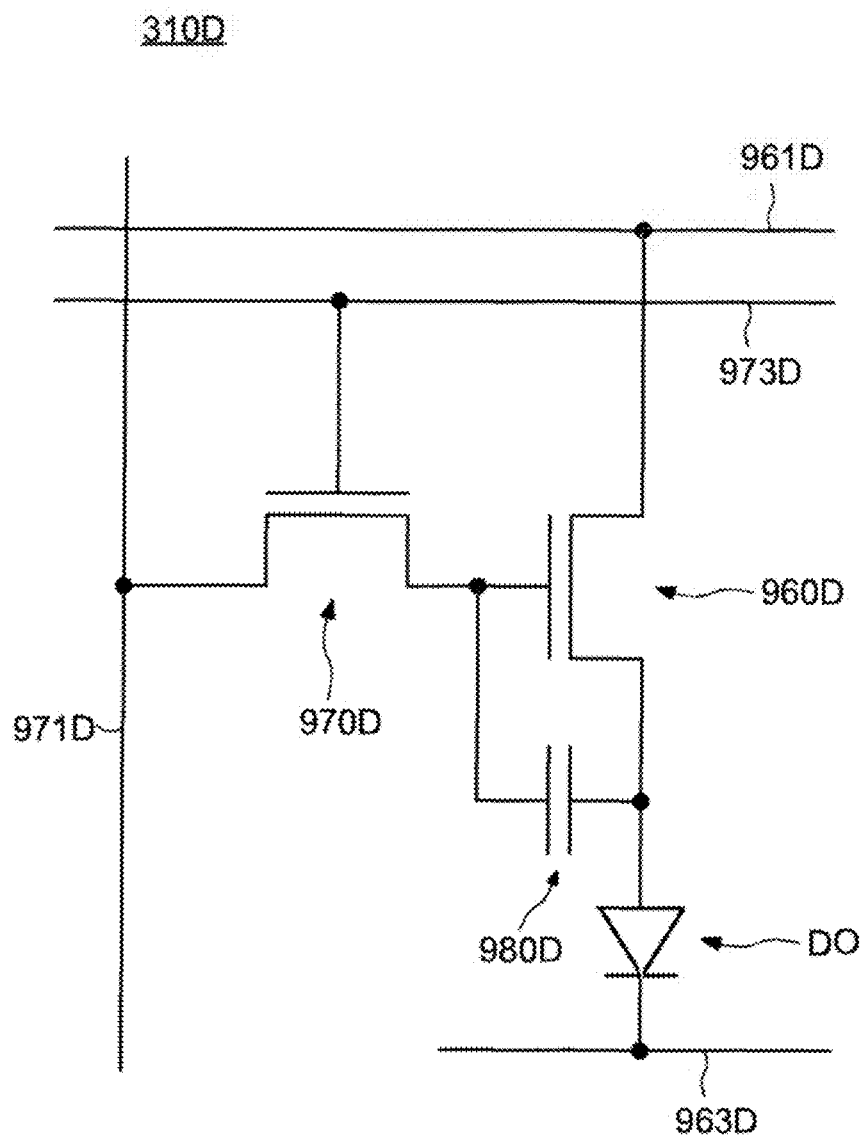
FIG. 11 is a equivalent circuit diagram showing a configuration of pixels of a display device according to an embodiment.
Figure 12:
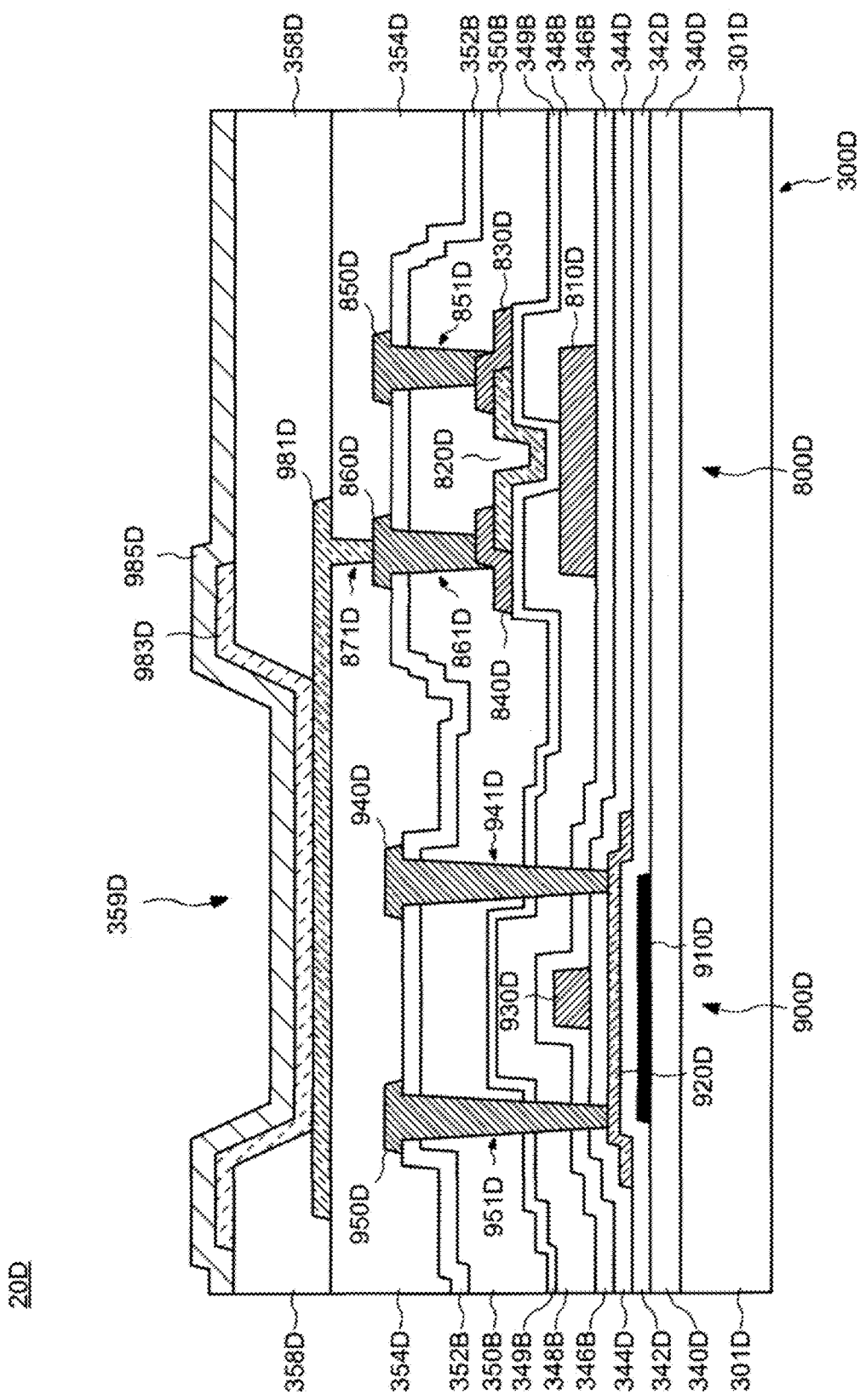
FIG. 12 is a cross-sectional view showing a configuration of a display device according to an embodiment.

In the present embodiment, a display device 20D using the semiconductor device 100 according to an embodiment will be described. In the present embodiment, a configuration in which the semiconductor device described in the first embodiment and the second embodiment is applied to a transistor constituting the pixel of the EL display device will be described. FIG. 11 is a equivalent circuit diagram showing a configuration of pixels of the display device 20D according to an embodiment. FIG. 12 is a cross-sectional view showing a configuration of the display device 20D according to an embodiment. Descriptions of configurations similar to those of FIGS. 1A to 10 may be omitted. The display device 20D using the semiconductor device 100 according to an embodiment is not limited to the configuration shown in FIGS. 11 and 12.

<3-1. Pixel 310D of Display Device 20D>

As shown in FIG. 11, a pixel 310D includes a drive transistor 960D, a selective transistor 970D, a storage capacitor 980D, and elements such as a light emitting element DO. The first terminal of the selective transistor 970D is connected to a signal line 971D, and the gate electrode of the selective transistor 970D is connected to a gate line 973D. A first terminal of the drive transistor 960D is connected to an anode power line 961D, and a second terminal of the drive transistor 960D is connected to one end of the light emitting element DO. The other end of the light emitting element DO is connected to a cathode electrode 963D. The gate electrode of the drive transistor 960D is connected to the second terminal of the selective transistor 970D. The storage capacitor 980D is connected to the gate electrode and the second terminal of the drive transistor 960D. The signal line 971D is supplied with a gradation signal for determining the emission intensity of the light emitting element DO. The gate line 973D is supplied with a signal for selecting a pixel row to which the gradation signal is to be written.

The configuration of the display device 20D is the same as the configuration in which the pixel 310B is replaced with the pixel 310D in the display device configuration shown in FIGS. 6 and 7. In addition, each pixel or sub-pixel has the light emitting element DO as the display element. A color filter may not be provided on the sub-pixel.

The semiconductor device 100 according to an embodiment can be applied to, for example, the drive transistor 960D. In the drive transistor 960D, since the voltage supplied to the first terminal is larger than the voltage supplied to the second terminal, when a current flows through the semiconductor film forming the drive transistor 960D, the AC-stress degradation of the semiconductor film becomes remarkable at the end part of the first terminal. In an embodiment, the configuration of the gate insulating film between the first terminal and the gate electrode of the drive transistor 960D is a stacked structure of a first gate insulating film 348D and a second gate insulating film 349D. As a result, the electric field between the first terminal and the gate electrode of the drive transistor 960D is relaxed, and the AC-stress degradation of the semiconductor film at the end part of the first terminal of the drive transistor 960D is suppressed. As a result, deterioration of characteristics of the drive transistor 960D is suppressed.

<3-2. Cross-Sectional Structure of Display Device 20D>

FIG. 12 is a cross-sectional view of the display device according to an embodiment. The configuration of the display device 20D shown in FIG. 12 is similar to the display device 20B shown in FIG. 9, except that the structure above an insulating layer 354D of the display device 20D differs from the structure above the insulating layer 354B of the display device 20B. Hereinafter, of the configuration of the display device 20D shown in FIG. 12, descriptions of the same configuration as the display device 20B shown in FIG. 9 will be omitted, and differences from the display device 20B will be described.

As shown in FIG. 12, the display device 20D has a pixel electrode 981D, a light emitting layer 983D, and a common electrode 985D above the insulating layer 354D. The pixel electrode 981D is provided over the insulating layer 354D and inside an opening 871D. An insulating layer 358D is provided over the pixel electrode 981D. The insulating layer 358D is provided with an opening 359D. The opening 359D corresponds to a light emitting region. That is, the insulating layer 358D defines a pixel. The light emitting layer 983D and the common electrode 985D are provided over the pixel electrode 981D exposed by the opening 359D. The pixel electrode 981D and the light emitting layer 983D are individually provided for the respective pixels. On the other hand, the common electrode 985D is commonly provided for the plurality of pixels. For the light emitting layer 983D, materials differing depending on the displayed colors of the pixels are used.

In this embodiment, the third modification of the semiconductor device 100 shown in FIG. 5 is applied, and the second gate insulating film 349D functioning as the second gate insulating film is formed first, and then the first gate insulating film 348D functioning as the first gate insulating film is formed. The stacking order of the first gate insulating film 348D functioning as the first gate insulating film and the second gate insulating film 349D functioning as the second gate insulating film may be different.

As described in the first embodiment and the second embodiment, when the pixels operate and the current flows through the channels of a semiconductor film 820D, the AC-stress degradation of the semiconductor film 820D becomes remarkable at the end part of a drain electrode 840D. In the display device 20D, similarly to the display device 20B, the gate insulating film between the drain electrode 840D and a gate electrode 810D is configured as a stacked structure of the first gate insulating film 348D and the second gate insulating film 349D. As a result, the electric field between the drain electrode 840D and the gate electrode 810D is relaxed, and the AC-stress degradation of the semiconductor film 820D is suppressed at the end part of the drain electrode 840D. As a result, deterioration of characteristics of a transistor 800D is suppressed.

Each of the embodiments described above as an embodiment of the present invention can be appropriately combined and implemented as long as there is no contradiction to each other. In addition, within the scope of the idea of the present invention, a person skilled in the art can correspond to various modifications and amendments, and it is understood that these modifications and modifications also belong to the scope of the present invention. For example, those skilled in the art could appropriately add, delete, or change the design of the constituent elements based on the each embodiment, or add, omit, or change the conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A semiconductor device comprising:
   a gate electrode;
   a first gate insulating film overlapping a part of a side surface and an upper surface of the gate electrode;
   a second gate insulating film overlapping a part of the upper surface of the gate electrode;
   a semiconductor film provided on an upper surface of the second gate insulating film and overlapping the gate electrode; and
   a first terminal and a second terminal overlapping an upper surface of the semiconductor film; wherein,
   in a plan view, a first region is a region in which the semiconductor film overlaps an upper surface of the first gate insulating film and the second gate insulating film between the first terminal and the second terminal, and a third region is a region that overlaps both a part of the upper surface of the gate electrode and the second gate insulating film and does not overlap the first gate insulating film, in the plan view, the first region is provided between the first terminal and the third region, and a dielectric constant of the first gate insulating film is smaller than a dielectric constant of the second gate insulating film.

2. The semiconductor device according to claim 1, wherein
the semiconductor film in the third region includes a channel.

3. The semiconductor device according to claim 1, wherein
the semiconductor film includes an oxide semiconductor.

4. The semiconductor device according to claim 1, wherein
a thickness of the first gate insulating film is thicker than a thickness of the second gate insulating film.

5. The semiconductor device according to claim 1, wherein
the first terminal is a drain electrode, and the second terminal is a source electrode.

6. The semiconductor device according to claim 1, wherein,
in a plan view, a second region is a region in which the semiconductor film overlaps the upper surface of the first gate insulating film and the second gate insulating film between the first terminal and the second terminal, and
the second region is provided between the second terminal and the third region in a plan view.

7. The semiconductor device according to claim 6, wherein
the first terminal is a source electrode, and the second terminal is a drain electrode.

8. A display device comprising:
a pixel having a light emitting element and a first transistor electrically connected to the light emitting element, wherein
the first transistor having a gate electrode, a first gate insulating film that overlaps a part of a side surface and an upper surface of the gate electrode, a second gate insulating film that overlaps a part of the upper surface of the gate electrode, a semiconductor film provided on an upper surface of the second gate insulating film and overlapping the gate electrode, and a first terminal and a second terminal that overlap an upper surface of the semiconductor film, in a plan view, a first region between the first terminal and the second terminal is a region in which the semiconductor film overlaps the upper surface of the first gate insulating film and the second gate insulating film, and a third region between the first terminal and the second terminal is a region in which the semiconductor film overlaps a part of the upper surface of the gate electrode and the second insulating film and does not overlap the first gate insulating film, in a plan view, the first region is provided between the first terminal and the third region, and a dielectric constant of the first gate insulating film is smaller than a dielectric constant of the second gate insulating film.

9. The display device according to claim 8, wherein
the semiconductor film in the third region includes a channel.

10. The display device according to claim 8, wherein
the semiconductor film includes an oxide semiconductor.

11. The display device according to claim 8, wherein
a thickness of the first gate insulating film is thicker than a thickness of the second gate insulating film.

12. The display device according to claim 8, wherein
the first terminal is a drain electrode, and the second terminal is a source electrode.

13. The display device according to claim 8, wherein,
in a plan view, a second region is a region in which the semiconductor film overlaps the tipper surface of the first gate insulating film and the second gate insulating film between the first terminal and the second terminal, and
the second region is provided between the second terminal and the third region in a plan view.

14. The display device according to claim 13, wherein
the first terminal is a source electrode, and the second terminal is a drain electrode.

* * * * *